(12) United States Patent
Hoobler et al.

(10) Patent No.: US 9,348,371 B2
(45) Date of Patent: *May 24, 2016

(54) PROTECTIVE CASE FOR A PORTABLE COMPUTING DEVICE

(71) Applicant: The Code Corporation, Draper, UT (US)

(72) Inventors: Ryan Hoobler, Salt Lake City, UT (US); Phil Utykanski, Saratoga Springs, UT (US)

(73) Assignee: The Code Corporation, Draper, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/818,859

(22) Filed: Aug. 5, 2015

(65) Prior Publication Data

US 2015/0338885 A1 Nov. 26, 2015

Related U.S. Application Data

(63) Continuation of application No. 14/067,780, filed on Oct. 30, 2013, now Pat. No. 9,122,941.

(51) Int. Cl.
*G06K 7/10* (2006.01)
*G06F 1/16* (2006.01)
*H05K 5/06* (2006.01)
*H05K 5/00* (2006.01)
*H04B 1/3888* (2015.01)

(52) U.S. Cl.
CPC ............ *G06F 1/1656* (2013.01); *G06F 1/1626* (2013.01); *G06F 1/1637* (2013.01); *G06K 7/10881* (2013.01); *H04B 1/3888* (2013.01); *H05K 5/0017* (2013.01); *H05K 5/0086* (2013.01); *H05K 5/061* (2013.01); *G06F 2200/1633* (2013.01)

(58) Field of Classification Search
USPC ................... 235/462.45, 472.01–472.03, 486
See application file for complete search history.

(56) References Cited

U.S. PATENT DOCUMENTS

| | | | | |
|---|---|---|---|---|
| 2003/0095374 A1* | 5/2003 | Richardson | ........... | G06F 1/1626 361/679.3 |
| 2012/0314354 A1* | 12/2012 | Rayner | ................ | G06F 1/1656 361/679.01 |
| 2014/0216952 A1* | 8/2014 | Liang | ...................... | H04M 1/18 206/37 |
| 2014/0274232 A1* | 9/2014 | Tages | ................... | H04B 1/3888 455/575.8 |
| 2014/0339012 A1* | 11/2014 | Richardson | ............ | G10K 11/18 181/202 |
| 2015/0136819 A1* | 5/2015 | Yang | ...................... | A45C 11/00 224/191 |
| 2015/0257285 A1* | 9/2015 | Wilson | ................. | H05K 5/0004 224/235 |
| 2015/0341072 A1* | 11/2015 | Lai | ........................ | H04B 1/3888 455/575.8 |
| 2016/0080024 A1* | 3/2016 | Wilson | .................... | H04M 1/18 455/575.8 |

* cited by examiner

*Primary Examiner* — Tuyen K Vo
(74) *Attorney, Agent, or Firm* — Timothy P. O'Hagan; Austin Rapp & Hardman

(57) ABSTRACT

A protective case for a portable computing device may include a rigid component comprising an upper surface and a cavity therein for receiving a portable computing device. The protective case may also include a cover having a surface area that is larger than the area of the upper surface that is open to the cavity. At least a central area of the cover may be transparent. The cover may be positioned over the cavity, and may also be positioned over part of the upper surface of the rigid component. The protective case may also include a pliable component molded around at least a portion of the rigid component and over a portion of the cover that is in contact with the upper surface of the rigid component, thereby forming a waterproof seal between the cover and the upper surface of the rigid component.

12 Claims, 2 Drawing Sheets

PROTECTIVE CASE FOR A PORTABLE COMPUTING DEVICE

CLAIM OF PRIORITY

This application is a continuation of U.S. patent application Ser. No. 14/067,780, titled "PROTECTIVE CASE FOR A PORTABLE COMPUTING DEVICE," filed Oct. 30, 2013, with inventors Ryan Hoobler and Phil Utykanski, which is incorporated herein by reference as if fully set forth.

TECHNICAL FIELD

The present disclosure relates generally to portable computing devices. More specifically, the present disclosure relates to a protective case for a portable computing device.

BACKGROUND

In the last several decades, advances in electronic technology have reduced the cost of increasingly complex and useful portable computing devices. Cost reduction and consumer demand have proliferated the use of portable computing devices such that they are practically ubiquitous in modern society, most often in connection with entertainment, communications and office productivity. Some examples of commonly used portable computing devices include smartphones, tablet computers, portable media players, etc.

Many portable computing devices include a touch screen display, i.e., an electronic visual display that the user can control through simple or multi-touch gestures by touching the screen with one or more fingers. A variety of protective cases are available for such portable computing devices. Some cases do not have any type of protective cover over the face of the touch screen display. Other cases include a protective transparent cover, but are not waterproof. Still other cases include a protective transparent cover, and are rendered waterproof through the use of an adhesive sealant.

Barcodes and barcode readers are also in widespread use today, particularly in commercial environments such as point-of-sale stations in retail stores and supermarkets, inventory and document tracking, and the like. A barcode is an optical machine-readable representation of information. Devices for identifying or extracting information from barcodes are generally referred to as barcode readers (or barcode scanners).

SUMMARY

One aspect of the present disclosure relates to a protective case for a portable computing device. The protective case may include a rigid component comprising an upper surface and a cavity therein for receiving the portable computing device. The cavity may define an area of the upper surface that is open to the cavity. The protective case may also include a cover having a surface area that is larger than the area of the upper surface that is open to the cavity. At least a central area of the cover may be transparent, so that the display of the portable computing device may be visible through the cover. The cover may be positioned over the cavity, and may also be positioned over part of the upper surface of the rigid component. The protective case may also include a pliable component molded around at least a portion of the rigid component and over a portion of the cover that is in contact with the upper surface of the rigid component, thereby forming a waterproof seal between the cover and the upper surface of the rigid component.

Another aspect of the present disclosure relates to a barcode reader accessory for coupling to a portable computing device. The barcode reader accessory may include a protective case, such as the protective case that was just described. In addition, the barcode reader accessory may include a barcode reader engine and a connector positioned within an interior portion of the protective case. The connector may be coupled to the barcode reader engine and mechanically configured to engage a mating connector on the portable computing device when the portable computing device is positioned within the protective case. The connector may include a contact for the exchange of data between the barcode reader engine and the portable computing device through a corresponding contact of the mating connector on the portable computing device.

DETAILED DESCRIPTION

Figure 1:
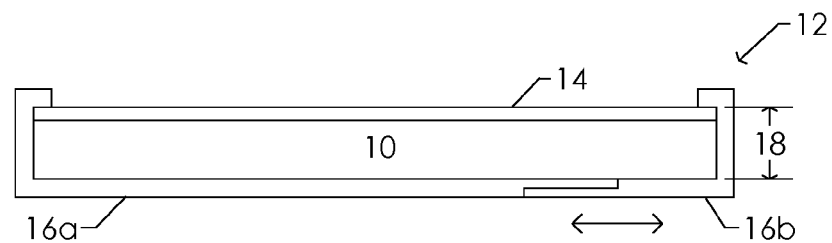
FIG. 1 shows a cross-sectional view of a prior art design for a protective case for a portable computing device.

FIG. 1 shows a cross-sectional view of a prior art design for a protective case 12 for a portable computing device 10 that includes a non-waterproof protective transparent cover 14. The case 12 includes two generally rigid plastic components 16a and 16b. Component 16a slides onto the device 10 from one direction and component 16b slides onto the device 10 from the other direction. When mated, they form a protective case 12 around the device 10. The throat 18 of each of the components 16a and 16b is slightly larger than the thickness of the device 10 so that the components 16a and 16b may also slide over the cover 14 when positioned on the face of the device 10. More specifically, the size of the throat 18 is equal to the thickness of the device 10 plus the thickness of the transparent cover 14.

Figure 2:
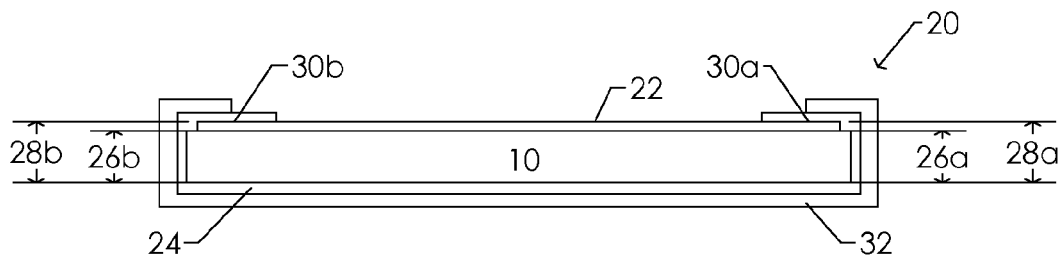
FIG. 2 shows a cross-sectional view of another prior art design for a protective case for a portable computing device.

FIG. 2 shows a cross-sectional view of another prior art design for a protective case 20 for a portable computing device 10 that includes a protective transparent cover 22. The case 20 includes a rigid plastic component 24 (or assembly of components secured together in a waterproof manner) that surrounds the device 10. The component 24 has a first throat 26a, 26b, which is substantially equal to the thickness of the device 10. The component 24 further has an expanded throat section 28a, 28b, which is the thickness of the device 10 plus the thickness of the transparent cover 22. To render the case 20 waterproof, an adhesive sealant is used at the surface 30a, 30b formed by the transparent cover 22 and the expanded throat section 28a, 28b. A pliable plastic component 32 such as a rubber over mold can surround a portion of the rigid plastic component 24 to provide further impact protection.

One embodiment of a protective case 34 in accordance with the present disclosure will be described in relation to FIGS. 3 and 4. This protective case 34 may be part of a barcode reader accessory 60 for a portable computing device 10.

The protective case 34 may include a rigid component 38. The rigid component 38 may be made of a relatively inflexible material, such as plastic. An upper surface 42 of the rigid component 38 may comprise a cavity 62 for receiving the portable computing device 10. The cavity 62 is shown in FIG. 4. The cavity 62 defines an area of the upper surface 42 that is open to the cavity 62. The cavity 62 may comprise an open section in the central part of the rigid component 38. The cavity 62 may be sized to fit the portable computing device 10, so that the portable computing device 10 may fit within the cavity 62. The cavity 62 may comprise a rectangular shape, to match the shape of the portable computing device 10.

The protective case 34 may also comprise a display cover 36. The display cover 36 may have a surface area that is larger than the area of the upper surface 42 that is open to the cavity 62. The entire surface area of the display cover 36 may be transparent. Alternatively, a central area 84 of the display cover 36 may be transparent, and other areas of the display cover 36 may be non-transparent. The display cover 36 may provide protection for the face of the portable computing device 10, and particularly the display (e.g., a touch screen display) of the portable computing device 10. When the accessory 60 is in its assembled form (as shown in FIG. 3), the display cover 36 may be positioned over the cavity 62 and may also be positioned over part of the upper surface 42 of the rigid component 38. More specifically, as can be seen in FIG. 4, the upper surface 42 of the rigid component 38 may comprise four sides that surround the rectangular-shaped cavity 62. When the display cover 36 is positioned over the cavity 62, the display cover 36 may be in contact with each of the four sides of the upper surface 42.

The protective case 34 may also include a pliable component 40. The pliable component 40 may be made of a relatively flexible material, such as rubber. As shown in FIG. 3, the pliable component 40 may be molded around the entire rigid component 38 (or substantially all of the rigid component 38). Alternatively, the pliable component 40 may only be molded around a portion of the rigid component 38. In addition, the pliable component 40 may be molded over a portion 80 of the display cover 36 that is in contact with the upper surface 42 of the rigid component 38.

Figure 3:
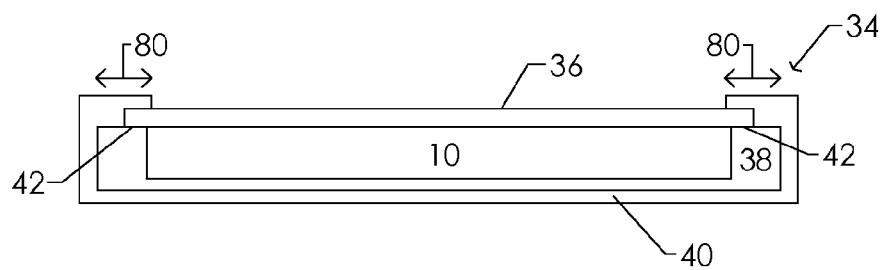
FIG. 3 shows a cross-sectional view of one embodiment of a barcode reader accessory comprising a protective case in accordance with the present disclosure.

In FIG. 3, the rigid component 38 is shown as a single component. However, as shown in FIG. 4, the rigid component 38 may comprise two separate components that are attached together. These separate components may be referred to herein as an upper rigid component 38a and a lower rigid component 38b.

Similarly, although the pliable component 40 is shown as a single component in FIG. 3, the pliable component 40 may also comprise two separate components. These separate components, which are shown in FIG. 4, may be referred to herein as an upper pliable component 40a and a lower pliable component 40b. The upper pliable component 40a may be molded over the upper rigid component 38a, and the lower pliable component 40b may be molded over the lower rigid component 38b.

In order to secure the display cover 36 in place, the display cover 36 may be positioned as described above (i.e., so that it covers the cavity 62 and is in contact with each of the four sides of the upper surface 42), and then the upper pliable component 40a may be molded over the upper rigid component 38a while the display cover 36 is in place. This molding operation may form a waterproof seal between the display cover 36 and the upper surface 42. The waterproof seal may be formed without the use of an adhesive sealant, which can be advantageous because it may simplify the manufacturing process and improve durability.

The upper rigid component 38a may include one or more features that simplify the process of positioning the display cover 36 in the correct location during manufacturing. For example, the upper rigid component 38a may include a ridge 72 that protrudes above the upper surface 42 around the perimeter of the upper surface 42. In the depicted embodiment, the ridge 72 extends around substantially the entire perimeter of the upper surface 42. In an alternative embodiment, the ridge 72 may only extend around a portion of the perimeter of the upper surface 42. With the ridge 72, the upper surface 42 forms the bottom of a shallow "tray" (or cavity) into which the display cover 36 may be positioned. The depth of this shallow tray may be considerably smaller than the depth of the cavity 62. The shallow tray formed by the ridge 72 may help to retain the display cover 36 in place once the display cover 36 has been correctly positioned.

Another feature that may simplify the manufacturing process is the presence of small positioning bosses 50 that protrude from the upper surface 42 of the upper rigid component 38a. The positioning bosses 50 may be located around the perimeter of the upper surface 42, just inside the ridge 72. The positioning bosses 50 may align with corresponding positioning cut-outs 52 located around the perimeter of the display cover 36. If the display cover 36 is positioned in such a way that the positioning bosses 50 do not align with the positioning cut-outs 52, then this indicates that the display cover 36 is positioned incorrectly.

Thus, the ridge 72 and the positioning bosses 50 in the upper rigid component 38a may make it easier for the display cover 36 to be correctly positioned (and to remain in the correct position) during manufacturing, particularly during the operation of molding the upper pliable component 40a over the assembly of the upper rigid component 38a and the display cover 36.

The upper rigid component 38a and the lower rigid component 38b may be hinged together to form a "clamshell," i.e., a device comprising two parts that are attached by a hinge and that open and close. The clamshell formed by the upper rigid component 38a and the lower rigid component 38b may be opened and closed to permit the portable computing device 10 to be inserted into and removed from the protective case 34. The upper rigid component 38a may comprise a first hinge part 44a, and the lower rigid component 38b may comprise a second hinge part 44b. In order to form the clamshell, the first hinge part 44a and the second hinge part 44b may be aligned and secured together. More specifically, the first hinge part 44a may comprise two separate sections, and the second hinge part 44b may be positioned between the separate sections of the first hinge part 44a, so that holes in the separate sections of the first hinge part 44a are aligned with a hole in the second hinge part 44b. A pin may then be placed through each of these holes in order to form a hinge that secures the upper rigid component 38a to the lower rigid component 38b.

Alternatively, the first hinge part 44a (with its separate sections) may be located on the lower rigid component 38b, and the second hinge part 44b may be located on the upper rigid component 38a. Other hinge configurations may also be utilized.

When the clamshell formed by the upper rigid component 38a and the lower rigid component 38b is in a closed position, the upper rigid component 38a and the lower rigid component 38b may be latched together so that the clamshell remains in the closed position. The lower rigid component 38b may comprise first latch components 82, and the upper rigid component 38a may comprise second latch components 86. The first latch components 82 and the second latch components 86 may be attached in order to maintain the clamshell in a closed position. More specifically, the first latch components 82 may comprise latches 82, and the second latch components 86 may comprise latch receptacles 86. The latches 82 may be inserted into the latch receptacles 86 in order to maintain the clamshell in the closed position. In alternative embodiments, other latch configurations may be utilized.

Figure 4:
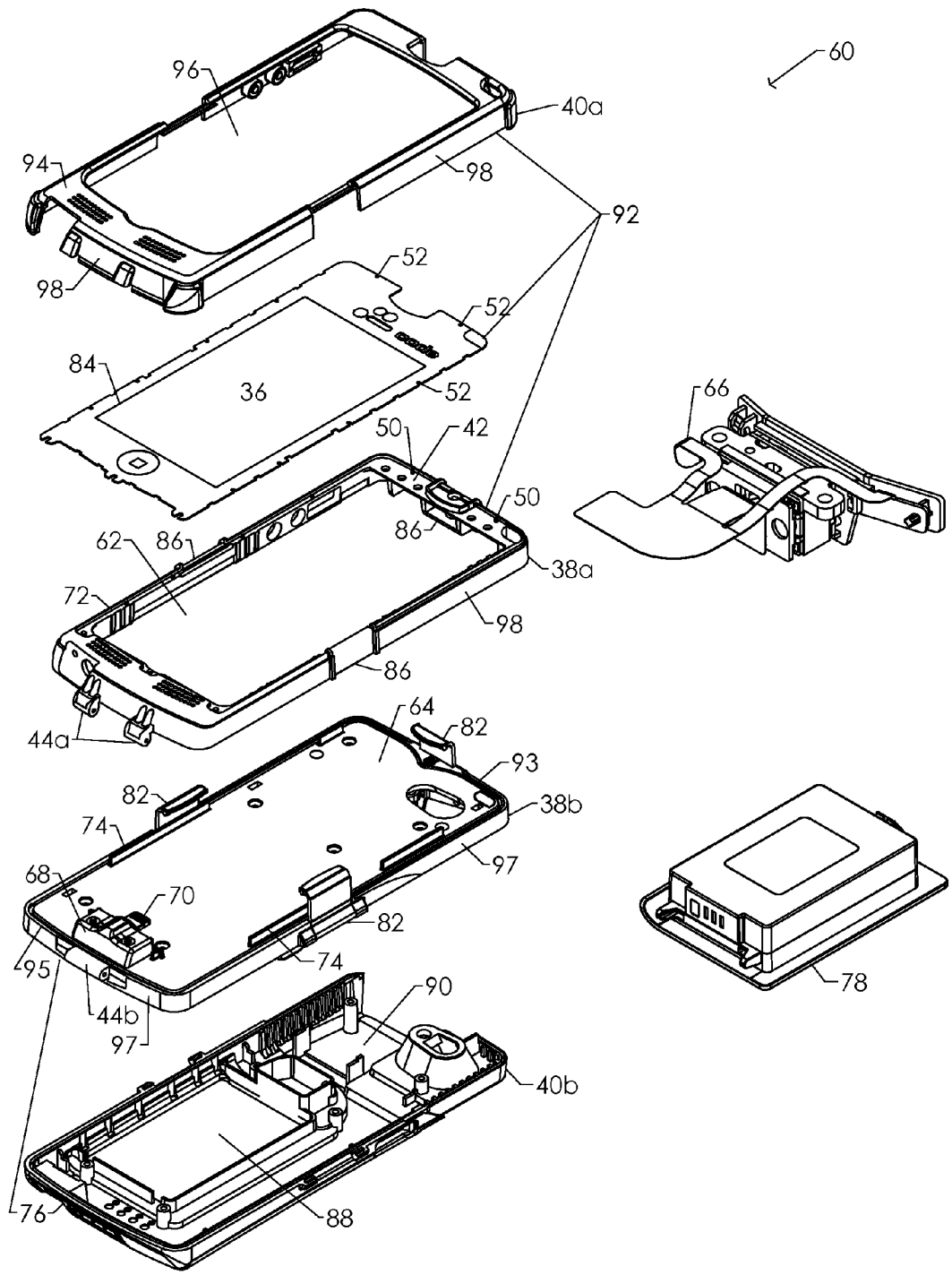
FIG. 4 shows an exploded view of the barcode reader accessory shown in FIG. 3.

As shown in FIG. 4, the lower rigid component 38b includes an upper surface 64. The upper surface 64 may be generally flat (planar) and smooth, so that a back surface of the portable computing device 10 (i.e., the surface that is opposite the surface with the display) may easily slide along the upper surface 64. When the upper rigid component 38a and the lower rigid component 38b are attached to one another, the upper surface 64 of the lower rigid component 38b becomes the lower surface 64 of the cavity 62. When the accessory 60 is in its assembled form, the back surface of the portable computing device 10 is positioned against the lower surface 64 of the cavity 62, and the lower surface 64 of the cavity 62 is substantially parallel to the upper surface 42 of the upper rigid component 38a.

The size of the upper rigid component 38a may be such that the depth of the cavity 62, measured from the upper surface 42 of the upper rigid component 38a to the lower surface 64 of the cavity 62, is substantially equal to the thickness of the portable computing device 10. Thus, when the accessory 60 is in its assembled form and the portable computing device 10 is positioned in the cavity 62, a face of the portable computing device 10 may be flush with the upper surface 42 of the upper rigid component 38a and in contact with the display cover 36. Moreover, the display of the portable computing device 10 may be in contact with the transparent area 84 of the display cover 36, so that the display is visible through the display cover 36.

The accessory 60 may also comprise a barcode reader engine 66, which is shown in FIG. 4. The barcode reader engine 66 may provide barcode reading functionality. The barcode reader engine 66 may include a camera for capturing an image of a barcode to be read. The camera may include a lens that focuses light reflected from a target area onto a photo sensor array. The barcode reader engine 66 may also include a decoder. Once an image of a barcode has been captured by the camera, the decoder may process the image and extract the information contained in the barcode.

The accessory 60 may also comprise a connector base 68 and an electrical connector 70 protruding from the connector base 68. As shown in FIG. 4, the connector base 68 may be located on, and protrude from, the surface 64 of the lower rigid component 38b. As indicated above, this surface 64 may also function as the lower surface 64 of the cavity 62. Thus, when the accessory 60 is in its assembled form, the connector base 68 may be positioned within an interior portion of the protective case 34.

The electrical connector 70 may facilitate electronic communication between the portable computing device 10 and the barcode reader engine 66. The electrical connector 70 may be electrically coupled to the barcode reader engine 66. That is, the electrical connector 70 may include one or more electrical conductors (e.g., electrical contacts) that interconnect the electrical connector 70 to the barcode reader engine 66. In addition, the electrical connector 70 may be mechanically configured to engage a mating electrical connector on the portable computing device 10 when the portable computing device 10 is positioned within the protective case 34. More specifically, the electrical connector 70 may be positioned so as to interconnect with a mating electrical connector positioned along an edge of the portable computing device 10 when the portable computing device 10 is enclosed within the protective case 34.

The electrical connector 70 may facilitate the exchange of data between the barcode reader engine 66 and the portable computing device 10 through a corresponding electrical contact of the mating connector on the portable computing device 10.

When the accessory 60 is in its assembled form and the portable computing device 10 is positioned therein, the barcode reader engine 66 and the portable computing device 10 may exchange data. The portable computing device 10 may transmit data to the barcode reader engine 66. For example, the portable computing device 10 may transmit a trigger signal to the barcode reader engine 66 to initiate reading of a barcode by the barcode reader engine 66. This trigger signal may be sent in response to user input to the portable computing device 10. The user input may be received via the touch screen display of the portable computing device 10. Alternatively, or in addition, the barcode reader engine 66 may transmit data to the portable computing device 10. For example, after reading and decoding a barcode, the barcode reader engine 66 may transmit decoded data to the portable computing device 10. The decoded data may be provided to an application running on the portable computing device 10 for additional processing. Alternatively, the barcode reader engine 66 may transmit image data to the portable computing device 10, and decoding software running on the portable computing device 10 may process the image data in an attempt to decode the barcode.

Because the rigid component 38 comprises two separate components 38a-b, a line may be visible between these components 38a-b when they are attached together. This line, which separates the upper rigid component 38a from the lower rigid component 38b, may be referred to herein as a part line. This part line may be planar with the lower surface 64 of the cavity 62.

Guides 74 may protrude from the lower surface 64 of the cavity 62. These guides 74 may make it easier to insert the portable computing device 10 into the protective case 34. Each guide 74 may be located close to one side of the lower rigid component 38b, and may be positioned parallel to the length of the lower rigid component 38b. The guides 74 may be spaced apart by a width of the portable computing device 10 so that the portable computing device 10 may be slid along the lower surface 64 of the cavity 62 between the guides 74.

The connector base 68 may be mounted to the lower surface 64 of the cavity 62 near one end. In order to insert the portable computing device 10 into the protective case 34, a surface of the portable computing device 10 (e.g., the back surface, opposite the surface with the display) may be placed in contact with the lower surface 64 of the cavity 62. The portable computing device 10 may then be slid between the two guides 74 along the lower surface 64 of the cavity 62 towards the electrical connector 70, so that the electrical connector 70 and the mating connector of the portable computing device 10 engage.

As indicated above, the lower pliable component 40b may be molded over the lower rigid component 38b. The lower pliable component 40b and the lower rigid component 38b may be referred to collectively as a lower enclosure 76. The space between the lower pliable component 40b and the lower rigid component 38b may be referred to as an interior region 90 of the lower enclosure 76.

The lower enclosure 76 may include the substantially planar upper surface 64 of the lower rigid component 38b, which also functions as the upper surface 64 of the lower enclosure 76. The interior region 90 is positioned below the back side of this upper surface 64 (i.e., the side of the lower rigid component 38b that is opposite the upper surface 64, which is not visible in FIG. 4). A back side of the portable computing device 10 may be positioned against the upper surface 64 when the portable computing device 10 is enclosed within the protective case 34. The barcode reader engine 66 may be positioned within the interior region 90 of the lower enclosure 76, below the upper surface 64 of the lower rigid component 38b (which, as indicated above, is also the lower surface 64 of the cavity 62). The lower rigid component 38b includes side walls 97 that extend downward from the upper surface 64.

The accessory 60 may also include a battery 78. The battery 78 may also be positioned within the interior region 90 of the lower enclosure 76 of the protective case 34, within an open section 88 of the interior region 90 that is shown in FIG. 4. The battery 78 may provide operating power to the barcode reader engine 66. The accessory 60 may include power leads that couple the battery 78 to the barcode reader engine 66. The battery 78 may also provide operating power to the portable computing device 10. If the portable computing device 10 includes its own battery, then the battery 78 may serve as a supplemental source of operating power for the portable computing device 10. The battery 78 may be electrically coupled to the electrical connector 70, and the electrical connector 70 may provide power to the portable computing device 10 through the mating electrical connector on the portable computing device 10.

When the accessory 60 is in its assembled form and the portable computing device 10 is positioned therein, the accessory 60 may be waterproof (i.e., it may prevent water from entering the cavity 62 where the portable computing device 10 is located). Thus, the protective case 34 may not comprise a hole for exposing a connector on the portable computing device 10, and it may not be possible to connect a cable to the portable computing device 10 when the portable computing device 10 is positioned within the accessory 60.

As indicated above, the upper pliable component 40a may be molded over the upper rigid component 38a while the display cover 36 is in place. This may have the effect of forming a cover 92 for the protective case 34. In other words, a protective case cover 92 may be formed from the upper rigid component 38a, the display cover 36, and the upper pliable component 40a.

The protective case cover 92 may be attached to the lower enclosure 76 by a hinge. More specifically, the upper rigid component 38a (which is part of the protective case cover 92) and the lower rigid component 38b (which is part of the lower enclosure 76) may be hinged together, as described above. The hinge may comprise, for example, a first hinge part 44a of the upper rigid component 38a, and a second hinge part 44b of the lower rigid component 38b, which may be aligned and secured together in the manner described above.

The connector base 68 protrudes near a bottom edge 95 of the upper surface 64 of the lower enclosure 76. When the protective case cover 92 is attached to the lower enclosure 76, the hinge (comprising the first hinge part 44a and the second hinge part 44b) is also positioned at the bottom edge 95 of the upper surface 64 of the lower enclosure 76.

The protective case cover 92 may be movable about an axis of the hinge between an open position and a closed position. Placing the protective case cover 92 in the open position exposes the upper surface 64 of the lower enclosure 76, such that the mating electrical connector of the portable computing device 10 may be engaged to the electrical connector 70 protruding from the connector base 68 by positioning the back side of the portable computing device 10 against the upper surface 64 and sliding the portable computing device 10 towards the electrical connector 70.

Placing the protective case cover 92 in the closed position forms a sealed cavity enclosing the portable computing device 10 when the mating electrical connector of the portable computing device 10 is engaged to the electrical connector 70. This sealed cavity will be explained in greater detail below.

The top portion of the protective case cover 92 includes a substantially planar surface. More specifically, when the upper pliable component 40a is molded over the upper rigid component 38a, a top surface 94 of the upper pliable component 40a (which functions as the top surface 94 of the protective case cover 92) and the display cover 36 form a substantially planar surface. The sealed cavity is formed by this substantially planar surface, peripheral walls 98 around the protective case cover 92, and the side walls 97 that extend downward from the upper surface 64 of the lower enclosure 76. The peripheral walls 98 that extend downward from the top surface 94 of the protective case cover 92 seal to the side walls 97 that extend downward from the upper surface 64 of the lower enclosure 76 when the protective case cover 92 is in the closed position. In this way, the protective case cover 92 may be considered to be cap shaped.

In an alternative embodiment, the peripheral walls 98 may extend upward from edges of the upper surface 64 of the lower enclosure 76, and they may seal to the top surface 94 of the protective case cover 92 (or to side walls that extend downward from the top surface 94 of the protective case cover 92).

Referring again to the depicted embodiment, the peripheral walls 98 that extend downward from the top surface 94 of the protective case cover 92 include a top peripheral wall (not visible in FIG. 4). Similarly, the side walls 97 that extend downward from the upper surface 64 of the lower enclosure 76 include a top side wall (not visible in FIG. 4), which extends downward from a top edge 93 of the upper surface 64. The top edge 93 of the upper surface 64 opposes the bottom edge 95 of the upper surface 64. When the protective case cover 92 is in the closed position, the top peripheral wall 98a seals against the top side wall at the top edge 93 of the upper surface 64.

The top surface 94 of the protective case cover 92 includes a window through which a display of the portable computing device 10 may be interacted with by a user. This window may comprise an open aperture 96 in the central part of the upper pliable component 40a. This window may also comprise the transparent central area 84 of the display cover 36. As indicated above, there may be a waterproof seal between the display cover 36 and the upper surface 42 of the upper rigid component 38a as well as between the display cover 36 and the upper rigid component 38a.

As used herein, two objects and/or axes are "substantially parallel" if they are at least within five degrees of parallel. As used herein, two metrics (such as thickness, depth, height, length, etc.) are "substantially equal" if they are at least within five percent of each other. As used herein, a surface is "substantially planar" if a majority of the surface is planar (i.e., flat).

The claims are not limited to the specific implementations described above. Various modifications, changes and variations may be made in the arrangement, operation and details of the implementations described herein without departing from the scope of the claims.

What is claimed is:

1. A protective case for a portable computing device, comprising:
an upper rigid component comprising an upper surface and an aperture within the upper surface that is open to a display face of the portable computing device;
a display cover having a surface area that is larger than the aperture within the upper surface, wherein at least a central area of the display cover is transparent, and wherein the display cover is positioned over the aperture and is also positioned over at least part of the upper surface of the upper rigid component; and a pliable component molded around at least a portion of the upper rigid component and over a portion of the display cover that is in contact with the upper surface of the upper rigid component, thereby forming a waterproof seal between the display cover and the upper surface of the upper rigid component.

2. The protective case of claim 1, further comprising peripheral walls around the periphery of the upper rigid component and extending downward from the upper surface to form a cavity within the upper rigid component below the upper surface, wherein the cavity is for receiving the portable computing device and, when the portable computing device is positioned in the cavity, the display face of the portable computing device is flush with the upper surface of the rigid component and in contact with the display cover.

3. The protective case of claim 2, wherein a depth of the cavity from the upper surface to a lower surface that is substantially parallel to the upper surface is substantially equal to a thickness of the portable computing device.

4. The protective case of claim 1, wherein the case further comprises:
a lower rigid component that is hinged to the upper rigid component to form a clamshell that can be opened and closed to permit insertion and removal of the portable computing device; and
a second pliable component positioned between the upper rigid component and the lower rigid component to form a water proof seal therebetween.

5. The protective case of claim 4, wherein:
the upper rigid component comprises a first hinge part;
the lower rigid component comprises a second hinge part; and
the first hinge part and the second hinge part are aligned and secured together in order to form the clamshell.

6. The protective case of claim 4, wherein:
the lower rigid component comprises a first latch component;
the upper rigid component comprises a second latch component; and
the first latch component and the second latch component are attached in order to maintain the clamshell in a closed position.

7. The protective case of claim 4, wherein the pliable component comprises:
an upper pliable component molded over the upper rigid component; and
a lower pliable component molded over the lower rigid component.

8. The protective case of claim 3, wherein the upper rigid component comprises a ridge that protrudes above the upper surface around at least a portion of the perimeter of the upper surface, such that the upper surface forms the bottom of a tray into which the display cover is positioned.

9. The protective case of claim 1, further comprising positioning bosses protruding from the upper surface of the rigid component, wherein the positioning bosses align with corresponding positioning cutouts in the display cover.

10. The protective case of claim 1, wherein:
the cavity comprises a rectangular shape;
the upper surface of the rigid component comprises four sides that surround the rectangular-shaped cavity; and
the display cover is in contact with each of the four sides of the upper surface.

11. The protective case of claim 1, wherein the waterproof seal is formed without the use of an adhesive sealant.

12. The protective case of claim 1, wherein the protective case does not comprise a hole for exposing a connector on the portable computing device.

* * * * *